US010821542B2

(12) United States Patent
Nelson et al.

(10) Patent No.: US 10,821,542 B2
(45) Date of Patent: Nov. 3, 2020

(54) PULSE SYNCHRONIZATION BY MONITORING POWER IN ANOTHER FREQUENCY BAND

(71) Applicant: MKS Instruments, Inc., Andover, MA (US)

(72) Inventors: Nicholas Nelson, East Rochester, NY (US); David J. Coumou, Webster, NY (US)

(73) Assignee: MKS Instruments, Inc., Andover, MA (US)

( * ) Notice: Subject to any disclaimer, the term of this patent is extended or adjusted under 35 U.S.C. 154(b) by 896 days.

(21) Appl. No.: 13/834,786

(22) Filed: Mar. 15, 2013

(65) Prior Publication Data
US 2014/0263199 A1 Sep. 18, 2014

(51) Int. Cl.
B23K 10/00 (2006.01)
B23K 20/10 (2006.01)
(Continued)

(52) U.S. Cl.
CPC ............ B23K 20/10 (2013.01); B23K 20/004 (2013.01); H01J 37/32082 (2013.01);
(Continued)

(58) Field of Classification Search
CPC ............ H01L 21/67069; H01J 37/3244; H01J 37/32082; H01J 37/32568; B23K 10/00
See application file for complete search history.

(56) References Cited

U.S. PATENT DOCUMENTS 4,017,855 A * 4/1977 Buck ........................ G01S 7/292
324/300
4,648,124 A * 3/1987 Mantovani ............. H04B 17/20
324/520
(Continued)

FOREIGN PATENT DOCUMENTS

DE 102010005799 A1 11/2010
EP 1783904 A1 5/2007
(Continued)

OTHER PUBLICATIONS

English translation of Taiwanese Office Action for Application No. 103103141 dated Feb. 24, 2017.
(Continued)

Primary Examiner — Ibrahime A Abraham
Assistant Examiner — Gyounghyun Bae
(74) Attorney, Agent, or Firm — Harness, Dickey & Pierce, P.L.C.

(57) ABSTRACT

A radio frequency (RF) power delivery system includes a first RF generator and a second RF generator. The first RF generator operates as a master RF generator, and the second RF generator operates as a slave RF generator. The slave RF generator includes a detector for sensing an electrical characteristic of the RF signal of the slave RF generator. The slave RF generator also includes a detector for sensing an electrical characteristic of the RF signal from the master RF generator. Operation of the slave RF generator is controlled by a host or controller. The host or controller operates the slave RF generator in accordance with electrical properties determined by the second detector.

40 Claims, 15 Drawing Sheets

(51) Int. Cl.
    *B23K 20/00* (2006.01)
    *H01J 37/32* (2006.01)
    *B23K 101/42* (2006.01)

(52) U.S. Cl.
    CPC .. *H01J 37/32165* (2013.01); *H01J 37/32183* (2013.01); *B23K 2101/42* (2018.08)

(56) References Cited

U.S. PATENT DOCUMENTS

| | | | | |
|---|---|---|---|---|
| 5,195,045 A * | 3/1993 | Keane | H01J 37/32082 | 315/111.51 |
| 5,573,595 A * | 11/1996 | Dible | C23C 16/505 | 118/723 E |
| 5,661,460 A * | 8/1997 | Sallen | G01S 13/84 | 340/539.1 |
| 5,810,963 A * | 9/1998 | Tomioka | C23C 16/509 | 156/345.28 |
| 5,901,348 A * | 5/1999 | Bang | H04B 1/64 | 455/226.1 |
| 5,953,656 A * | 9/1999 | Bertocci | H04M 1/72505 | 455/412.2 |
| 6,174,450 B1 * | 1/2001 | Patrick | H01J 37/32082 | 118/723 E |
| 6,313,584 B1 * | 11/2001 | Johnson | H01J 37/32082 | 315/111.21 |
| 6,351,683 B1 * | 2/2002 | Johnson | H01J 37/3299 | 700/121 |
| 6,522,121 B2 | 2/2003 | Coumou | | |
| 6,545,420 B1 * | 4/2003 | Collins | C23C 16/509 | 118/723 ER |
| 6,707,255 B2 | 3/2004 | Coumou et al. | | |
| 6,879,817 B1 * | 4/2005 | Sorrells | H03C 3/40 | 455/207 |
| 7,970,562 B2 * | 6/2011 | van Zyl | G01R 19/0007 | 118/723 E |
| 8,040,068 B2 * | 10/2011 | Coumou | H01J 37/32082 | 315/111.21 |
| 8,395,322 B2 * | 3/2013 | Coumou | H01J 37/32082 | 315/111.21 |
| 8,659,335 B2 * | 2/2014 | Nagarkatti | H03F 3/189 | 315/111.21 |
| 9,408,288 B2 | 8/2016 | Valcore, Jr. et al. | | |
| 9,536,749 B2 | 1/2017 | Marakhtanov et al. | | |
| 2001/0021422 A1 * | 9/2001 | Yamakoshi | H01J 37/32082 | 427/569 |
| 2004/0007984 A1 * | 1/2004 | Coumou | H01J 37/32082 | 315/111.41 |
| 2004/0021864 A1 * | 2/2004 | McAlexander | G01M 11/3181 | 356/364 |
| 2004/0263412 A1 * | 12/2004 | Pribyl | H01J 37/32082 | 343/866 |
| 2005/0205676 A1 * | 9/2005 | Saito | G01S 13/74 | 235/439 |
| 2005/0241762 A1 * | 11/2005 | Paterson | H01J 37/32082 | 156/345.28 |
| 2006/0021970 A1 * | 2/2006 | Parsons | H01J 37/32935 | 216/59 |
| 2006/0241879 A1 * | 10/2006 | van Zyl | H01J 37/32082 | 702/60 |
| 2007/0006972 A1 * | 1/2007 | Piptone | H01J 37/321 | 156/345.48 |
| 2008/0179948 A1 * | 7/2008 | Nagarkatti | H01J 37/32082 | 307/18 |
| 2008/0197854 A1 * | 8/2008 | Valcore | H01J 37/32082 | 324/500 |
| 2008/0227420 A1 | 9/2008 | Choueiry et al. | | |
| 2008/0230008 A1 | 9/2008 | Paterson et al. | | |
| 2009/0284156 A1 | 11/2009 | Banna et al. | | |
| 2009/0297404 A1 | 12/2009 | Shannon et al. | | |
| 2009/0321428 A1 * | 12/2009 | Hyde | H05B 6/6455 | 219/702 |
| 2011/0031216 A1 | 2/2011 | Liao et al. | | |
| 2011/0136460 A1 * | 6/2011 | Cho | H03D 7/165 | 455/302 |
| 2011/0309049 A1 * | 12/2011 | Papasouliotis | H01J 37/32146 | 216/37 |
| 2012/0000888 A1 * | 1/2012 | Kawasaki | H01J 37/32082 | 216/67 |
| 2013/0002136 A1 | 1/2013 | Blackburn et al. | | |
| 2013/0009545 A1 * | 1/2013 | Benjamin | H01J 37/32082 | 315/111.21 |
| 2013/0214828 A1 * | 8/2013 | Valcore, Jr. | H01J 37/32146 | 327/141 |
| 2013/0222055 A1 * | 8/2013 | Coumou | H03F 1/0211 | 330/75 |
| 2014/0097908 A1 * | 4/2014 | Fisk, II | H01J 37/32174 | 331/15 |
| 2014/0155013 A1 * | 6/2014 | Murphy | H03F 1/0277 | 455/256 |

FOREIGN PATENT DOCUMENTS

| | | |
|---|---|---|
| JP | H10510095 A | 9/1998 |
| JP | 2002367962 A | 12/2002 |
| TW | 200904260 A | 1/2009 |
| WO | 97/12502 A1 | 4/1997 |

OTHER PUBLICATIONS

English translation of Japanese Office Action for App. No. 2016-500110 dated Nov. 28, 2016.
Taiwanese Office Action for Application No. 103103141 dated Sep. 20, 2016, and its English translation thereof.
Chinese Office Action for Application No. 201380074722.5 dated Sep. 29, 2016, and its English translation thereof.
English translation of Korean Office Action for Application No. 10-2015-7026945 dated Jan. 16, 2017.
German Office Action for Application No. 11 2013 006 834.6 dated Jul. 12, 2019 and its English translation thereof.

* cited by examiner

PULSE SYNCHRONIZATION BY MONITORING POWER IN ANOTHER FREQUENCY BAND

FIELD

The present disclosure relates to efficiently synchronizing pulsing between RF generators.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator, a matching network, and a load, such as a plasma chamber. The RF generator generates RF power signals, which are received at the matching network. The matching network matches an input impedance of the matching network to a characteristic impedance of a transmission line between the RF generator and the matching network. This impedance matching aids in minimizing an amount of power forwarded to the matching network ("forward power") and reflected back from the matching network to the RF generator ("reverse power"). The impedance matching also aids in maximizing power forwarded from the matching network to the plasma chamber.

In the RF power supply field, there are typically two approaches to applying the RF signal to the load. A first, more traditional approach is to apply a continuous wave signal to the load. The continuous wave signal is typically a sinusoidal wave that is output continuously by the power supply to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulsed mode of operation, a RF sinusoidal signal is modulated by a modulation signal in order to define an envelope for the modulated sinusoidal signal. In a conventional pulsed modulation scheme, the RF sinusoidal signal typically is output at a constant frequency and amplitude. Power delivered to the load is varied by varying the modulation signal, rather than varying the sinusoidal, RF signal. The modulation may be amplitude modulation for on/off pulse sequences. The amplitude modulation may be multilevel.

As plasma systems have evolved, many new challenges for both continuous wave and pulsed RF control exist to meet the specifications required to meet critical manufacturing specifications. One advancement is the use of multiple RF sources for increased control of various plasma parameters. These parameters include electron density, electron temperature, ion flux, and ion energy. Dual RF plasma systems have been developed in order to enable independent control of ion energy and ion flux. Thin film processing has evolved to use three RF plasma systems for control of the actual energy distribution of ions incident on the surface of the material, in addition to controlling ion energy and ion flux. Further yet, phase locked high density systems having supplemental RF biasing have become important to various etching applications. The success of multiple power sources to independently control plasma parameters such as ion flux and ion energy to the surface of a processed material have presented even greater challenges to the delivery of RF power coupling and control in pulsed RF plasma systems.

In cases where more than one generator provides RF power to a chamber, it is desirable that all RF generators pulse their output in a synchronized manner. Synchronization can mean either absolute or relative synchronization. One approach to synchronization is to connect all the RF generators to a common source signal generator so that all RF generators synchronize to the common source signal. US Patent Application No. 2009/0284156 shows an example of such an approach. This approach is not always feasible because it requires that all of the RF generators be designed specifically with the intention of pulse synchronization and requires compatible synchronization hardware and signal levels. With reference to FIG. 1, another approach involves using a master RF generator 12 to pulse asynchronously to the other RF generators 14. The master RF generator broadcasts its pulse train via a connection to the other slave RF generators. This approach also requires common hardware on the master and the slave RF generators. FIG. 1 depicts a block diagram of this second approach.

SUMMARY

A radio frequency (RF) power delivery system includes a first RF generator providing a first RF signal for delivery to a load. A second RF generator provides a second RF signal for delivery to the load. The second RF generator includes a first detector that detects an electrical property of the first RF signal and a second detector that detects an electrical property of the second RF signal. Operation of the second RF generator is coordinated with operation of the first RF generator in accordance with the electrical property detected by the first detector.

A radio frequency (RF) power delivery system includes a plurality of RF generators that provide a respective plurality of RF signals for delivery to a load. A plurality of detectors are associated with at least one of the plurality of RF generators. The plurality of detectors are configured to detect an electrical property of selected ones of the plurality of RF signals. Operation of the RF generators is coordinated in accordance with the respective electrical properties detected by the plurality of detectors.

A radio frequency (RF) power delivery system includes a first RF generator providing a first RF signal for delivery to a load. A second RF generator provides a second RF signal for delivery to the load. A first matching network is disposed between the first RF generator and the load. A second matching network is disposed between the second RF generator and the load. The second matching network includes a first detector. The first detector detects an electrical property of the first RF signal, and a second detector detects an electrical property of the second RF signal. Operation of the second RF generator is coordinated with operation of the first RF generator in accordance with the electrical property detected by the first detector.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, and like reference numerals refer to similar elements.

DETAILED DESCRIPTION

Figure 1:
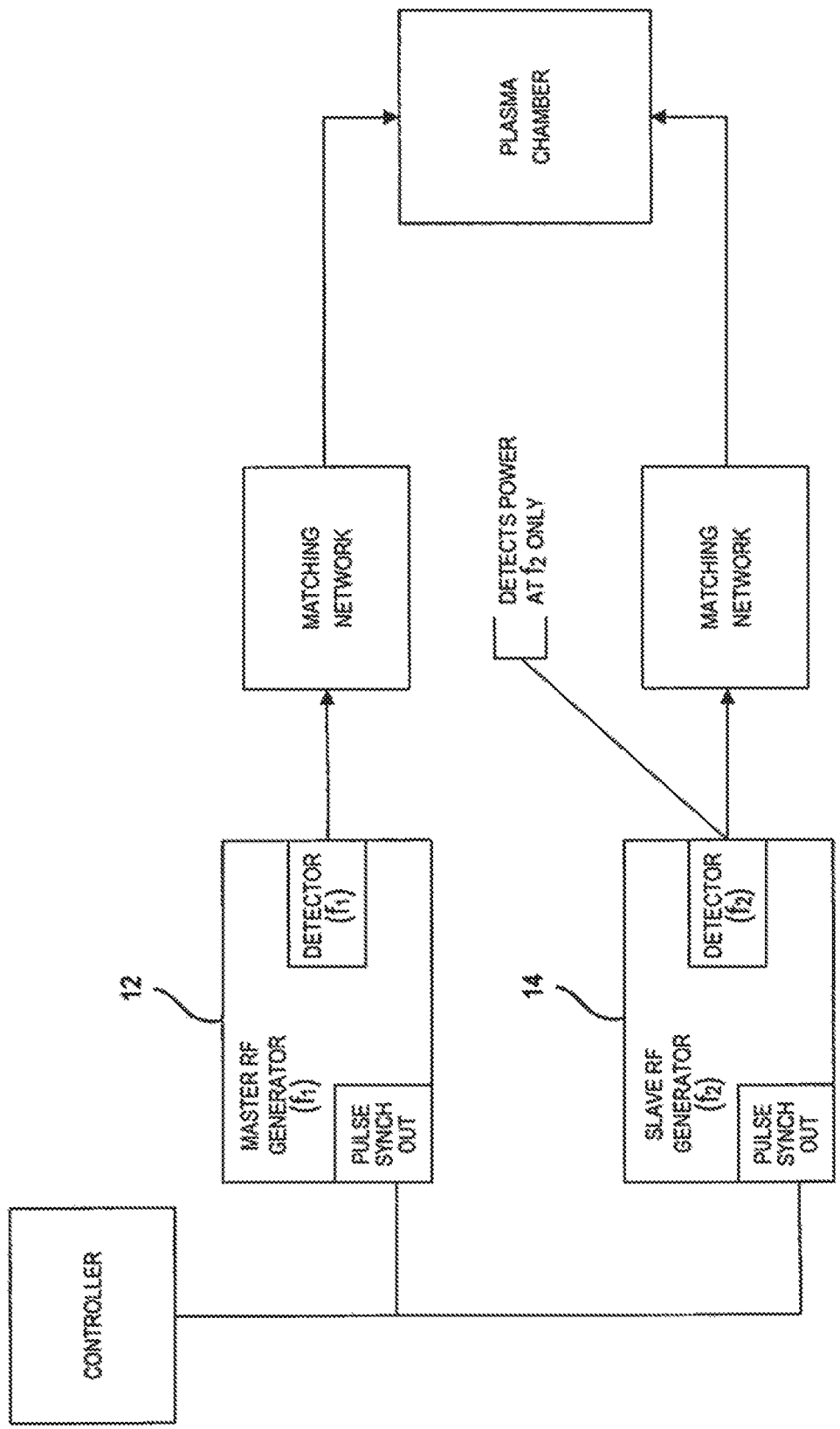
FIG. 1 is a functional block diagram of a system having multiple RF generators arranged as is known in the prior art.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
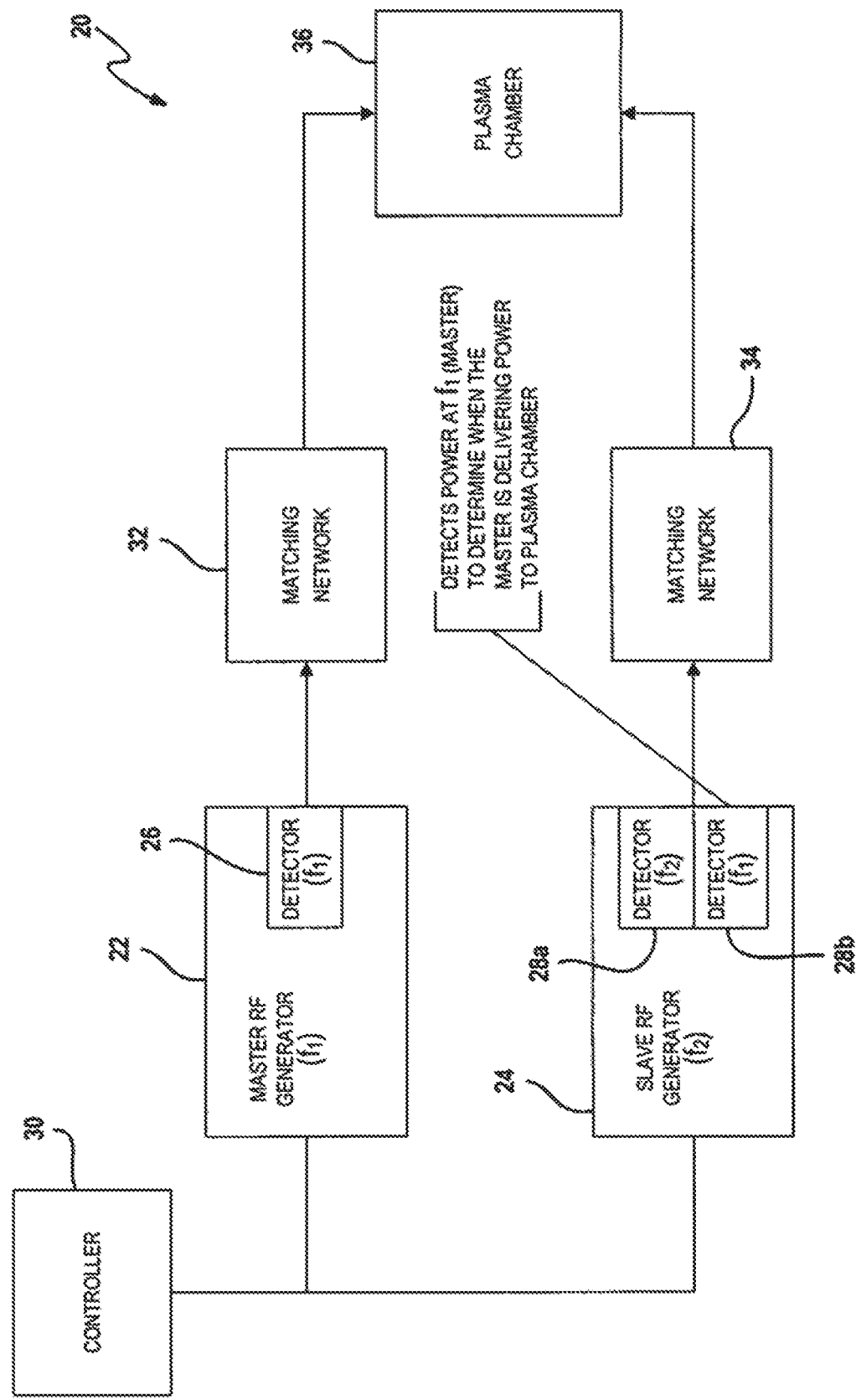
FIG. 2 is a block diagram of a signal processing system according to various embodiments of the present disclosure.

Modern RF generators have a flexible broad-spectrum RF detector that can detect power at more than one frequency and process those signals concurrently with the fundamental frequency of the RF generator. With reference to FIG. 2, FIG. 2 depicts a pulse synchronization system 20. When multiple RF generators 22, 24 are connected to a common plasma chamber 36, some power from each RF generator is reflected out of the chamber and is incident on a respective detector 26, 28a, 28b of the other RF generator 22, 24. The slave RF generator 24 can sense the output power of the master RF generator 22. This method may be referred to as direct detection. A respective matching (or match) network 32, 34 is interposed between RF generators 22, 24. The host or controller 30 informs the slave that it is a slave RF generator. After a plasma is established by either the master 22 or the slave 24 generator in continuous RF power mode, the host 30 commands the master RF generator 22 to start pulsing.

In various embodiments, the detector may include various combinations of hardware and software. In one non-limiting example, the detector may receive a signal from a sensor and analyzes the signal through a combination of hardware, firmware, and/or software. In such a configuration, the term detector can refer to the module that analyzes the signal from the sensor or a combination of the module that analyzes the signal from the sensor and the sensor. A sensor as defined in the present disclosure may be a directional coupler outputting forward and reverse power signals, a VI probe outputting voltage and current signals, or other detector known in the art, according to various embodiments. In various embodiments, a detector may refer to a module that processes the output of a sensor, and multiple detectors, such as detector 28a, 28b, may referred to a module that analyzes the signal from the sensor at a particular frequency. In other various embodiments, a detector may refer to a combination of a sensor and a module that processes the output of a sensor, and multiple detectors, such as detector 28a, 28b, may refer to a combination of a single or multiple sensors and a module that analyzes the signal from the sensor at one or a plurality of particular frequencies.

Figure 4:
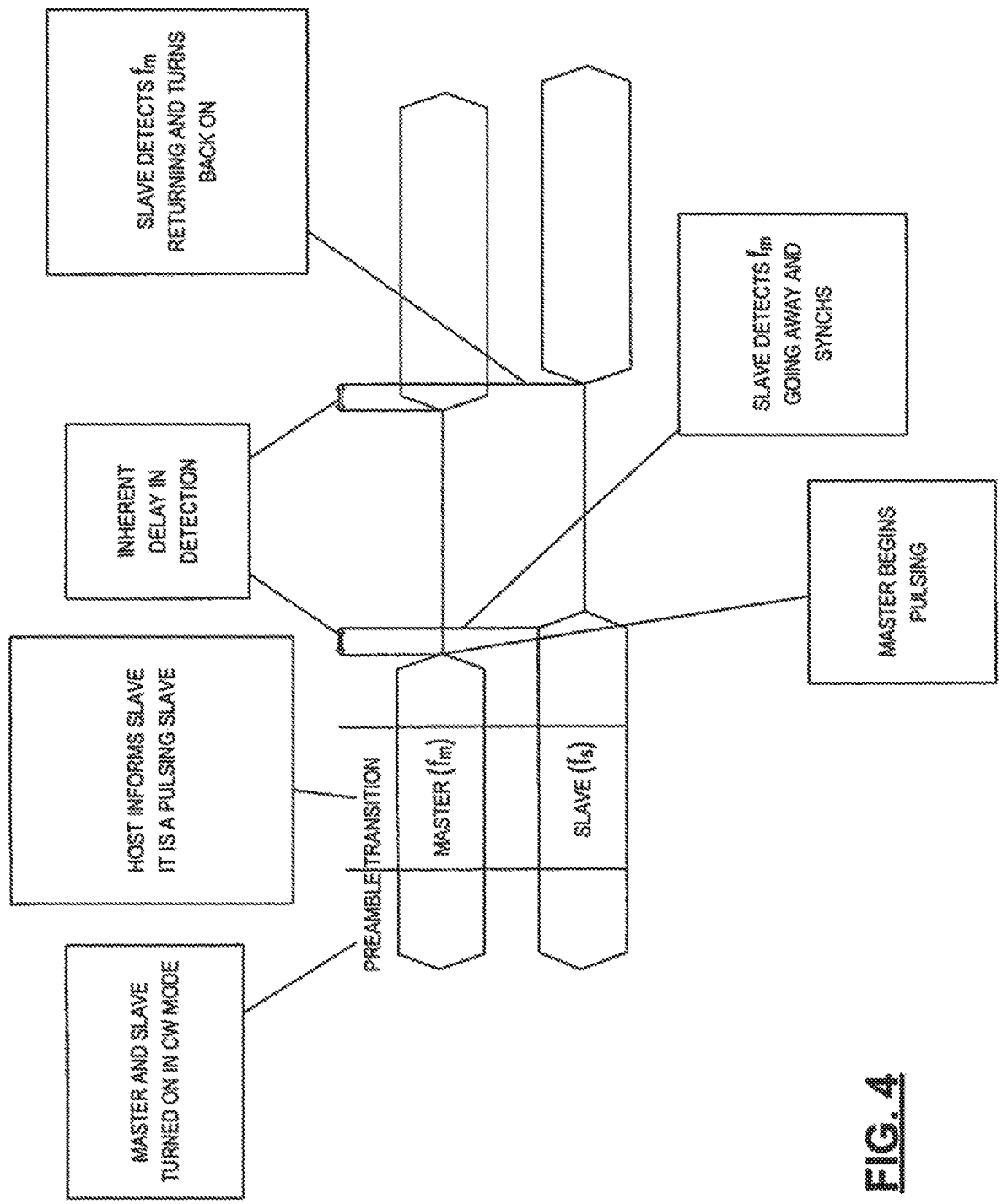
FIG. 4 is a transition diagram depicting operation of a system having multiple RF generators arranged in accordance with various embodiments of the present disclosure.

FIG. 4 depicts a transition diagram illustrating the operation of the various embodiments of FIG. 2. In a fully synchronized embodiment, such as in FIG. 2, as soon as the slave RF generator 24 detects the frequency of the master 22, such as by detecting an edge of the master RF generator signal, the slave RF generator turns off RF power. Rising edge detection is equally possible. By way of non-limiting example, IMD detection typically detects a falling edge. Harmonic or fundamental detection typically detects a rising edge or a falling edge. When the slave RF generator 24 detects the frequency of the master 22 again, it turns on RF power.

In various embodiments, there are different pulse sequencing for plasma discharges with multiple RF sources. The master and slave may turn on simultaneously, the slave may turn on after the master for a prescribed delay time, or the slave may be on continuous wave (CW) mode while the master pulses. In various embodiments, the out-of-band energy does not pose an adverse effect to power regulation, as discussed in U.S. Pat. No. 6,707,255, issued Jul. 10, 2002, assigned to the assignee of the present application, and incorporated by reference herein.

The presence of harmonic or intermodulation distortion (IMD) can be explained by sheath equations. The formulation of the sheath is generalized by the sum of the contributions by the RF sources $$s = s_1 + s_2 + \ldots$$

where the subscript is an index of a respective one of multiple RF sources. The sheath is characterized by the RF source as $$s_i = \frac{I_i}{en_e \omega_i A}$$

where:
I—current;
$n_e$—electron density;
A—electrode area;
e—electron charge constant; and
ω—RF frequency.
The sheath for a dual RF configuration is then derived as $$s = s_1 + s_2 + s_1 \sin(\omega_1 t) + s_2 \sin(\omega_2 t).$$

The harmonic energy and IMD products are created by the squared sheath term in the modulation of the sheath voltage, $$V_s(t) = -\frac{en_e}{2e_o} s^2.$$

Figure 3:
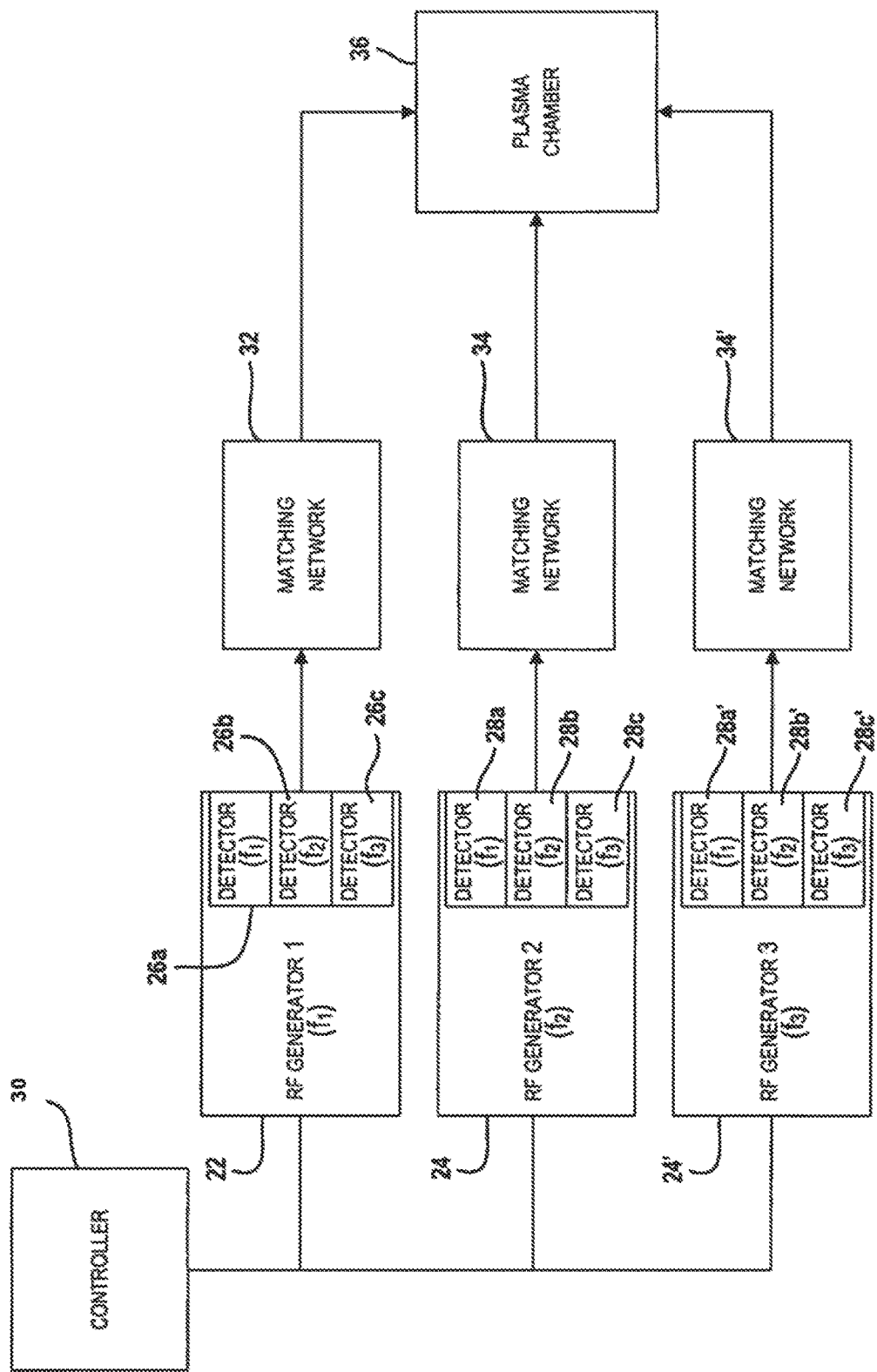
FIG. 3 is a functional block diagram of a system having a pair of RF generators arranged in accordance with various embodiments of the present disclosure.
Figure 5:
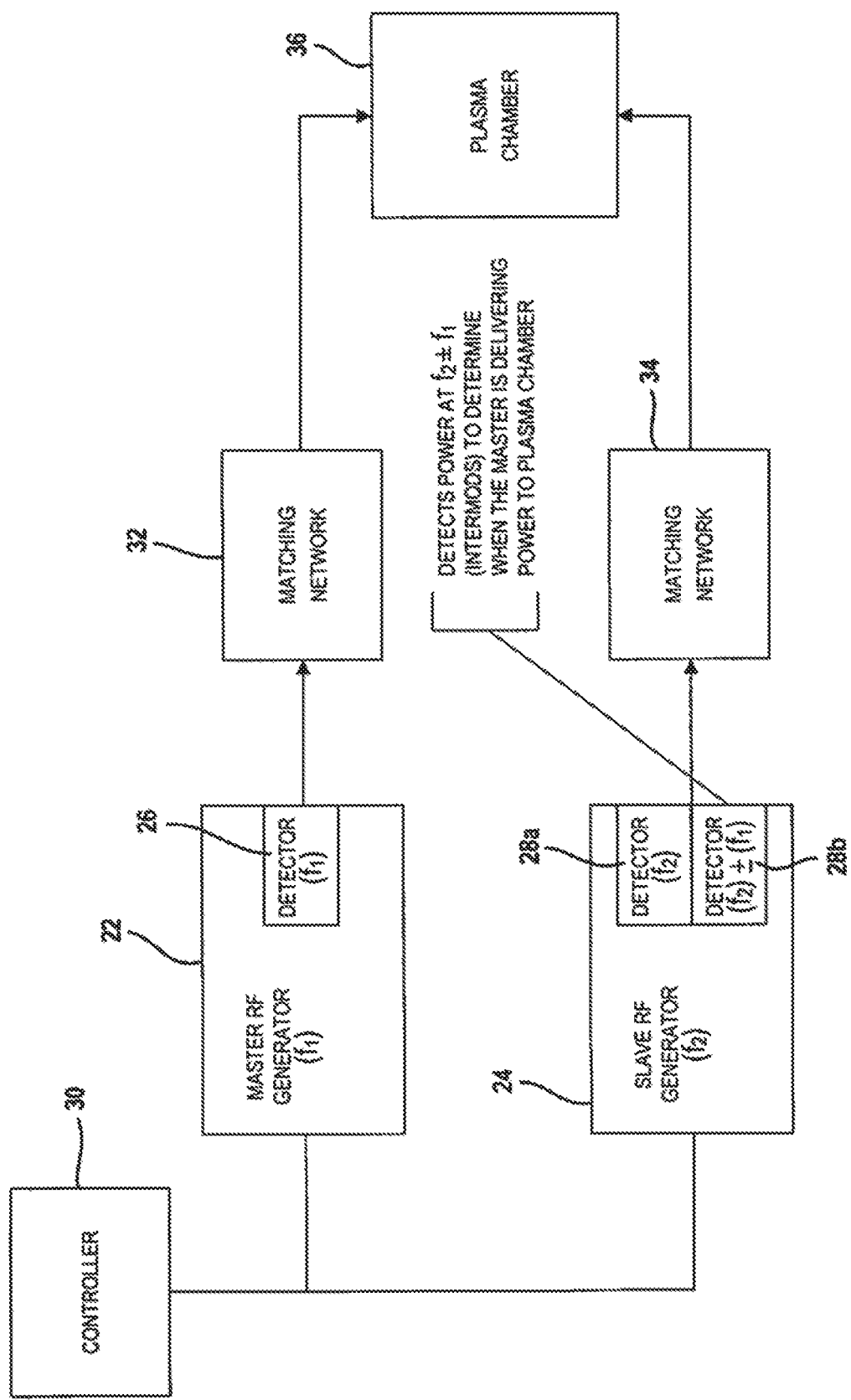
FIG. 5 is a functional block diagram of a system having a pair of RF generators for detecting the frequency of one of the RF generators by examining intermodulation products.
Figure 6:
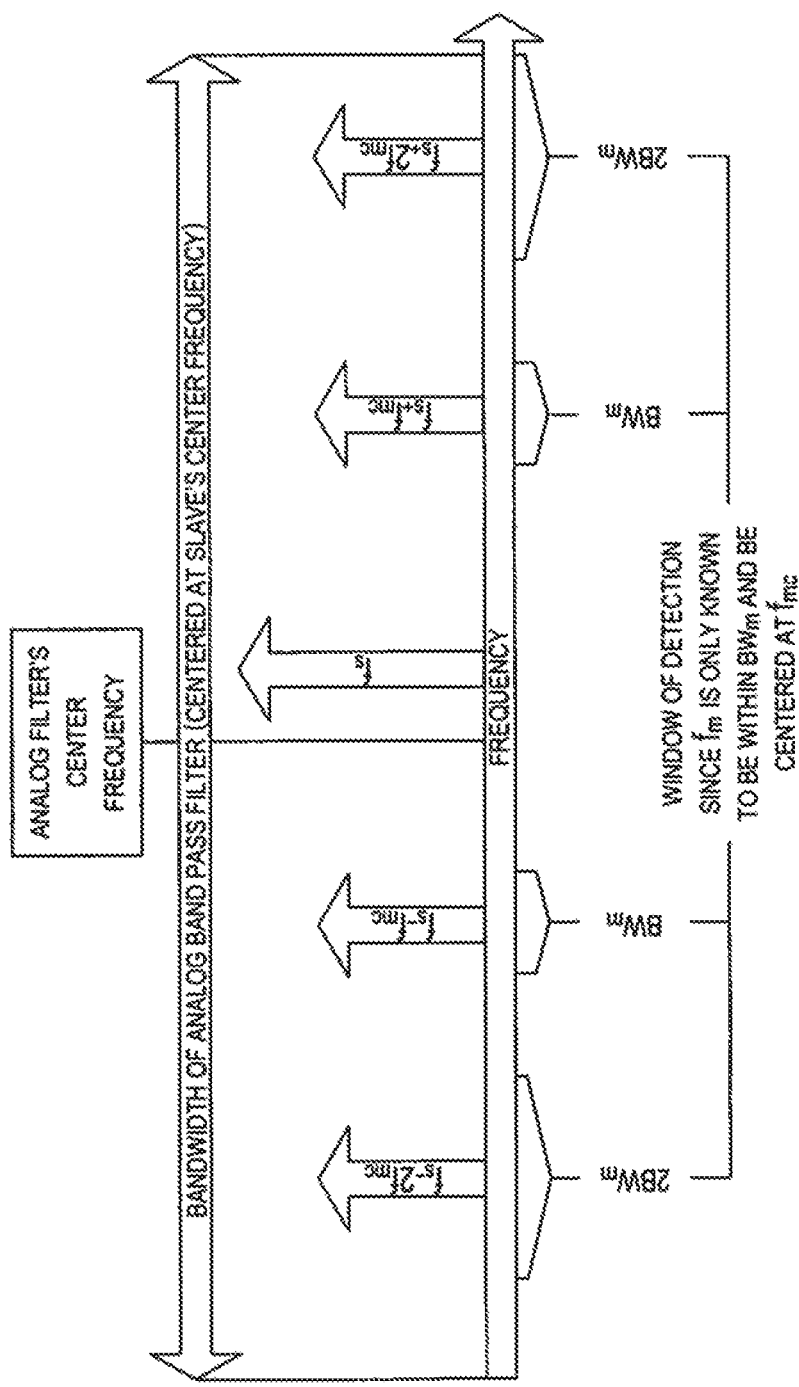
FIG. 6 illustrates frequency detection in the presence of intermodulation products in accordance with various embodiments.
Figure 7:
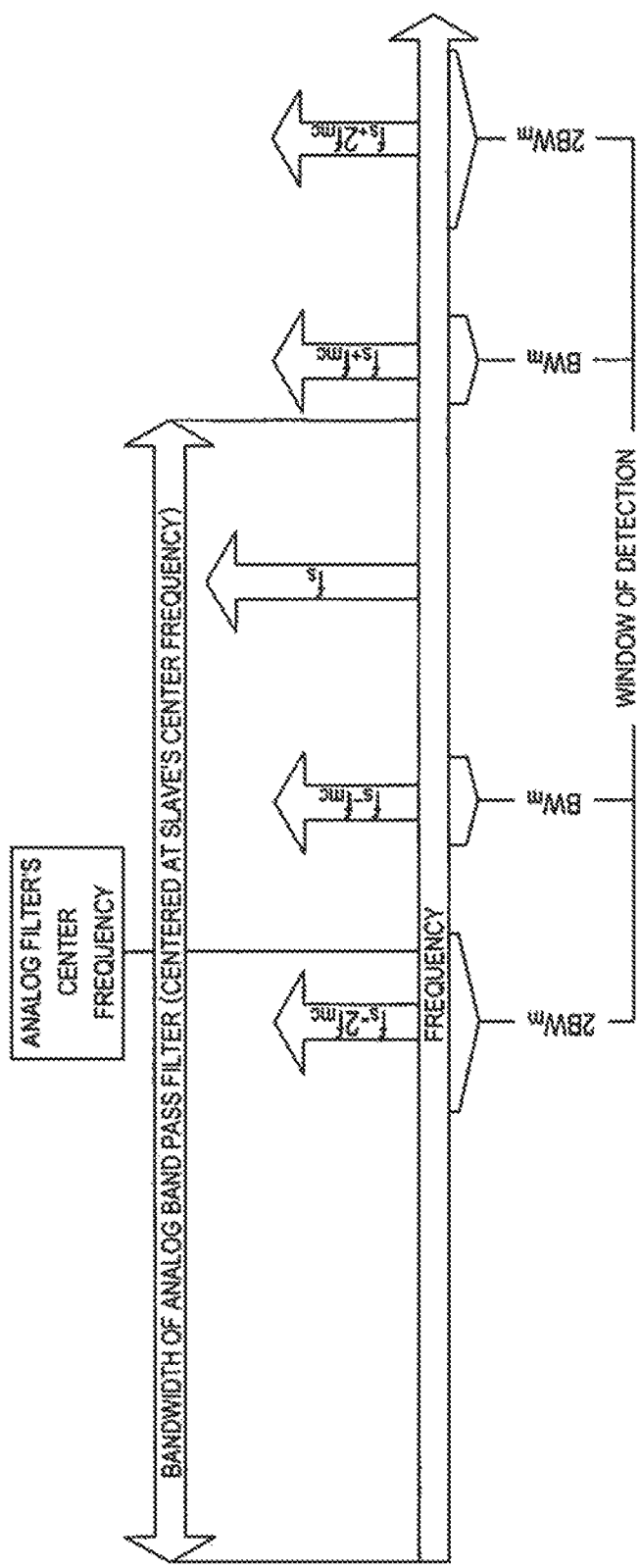
FIG. 7 illustrates frequency detection in the presence of intermodulation products where the intermodulation frequencies are separated by more than a predetermined threshold according to various embodiments.

The embodiment of FIGS. 2 and 3 are directed to systems of fixed frequency RF generators. However, it is common to utilize frequency agile RF generators that change frequency quickly and autonomously. FIGS. 5-7 show various embodiments that employ frequency agile RF generators. Frequency agile RF generators typically operate at a center frequency within a frequency range, ±5 or 10% of the center frequency, by way of non-limiting example. The detector in an agile frequency system thus incorporates a wider spectrum window of detection. This enables the detector to detect all power in a frequency range without needing to adjust its detection parameters. For ease of reference, the frequency detection band will be referred to for the master and slave, respectively, as $BW_m$ and $BW_s$.

In some instances, the $BW_m$ is not detectable by the slave RF generator 24, 24' due to analog filtering in the matching network 34, 34' and in the detector 28, 28'. When this occurs, the detector 28, 28' analyzes the intermodulation products. Intermodulation products are formed from the product of two sinusoidal frequencies. The following discussion refers to first order IMD effects. In various embodiments, higher order IMD products are present in the plasma emission. By way of example only, two sinusoidal frequencies $f_1$ and $f_2$ combine to form $f_1 \pm f_2$. The products are also formed from mixing with the harmonics of the fundamental frequencies. For the case of the master fundamental frequency $f_m$ (with bandwidth $BW_m$) combining with the slave fundamental frequency $f_s$, the resulting signal has a bandwidth of $BW_m$ and is centered at $f_s \pm f_{mc}$, where $f_{mc}$ is the center frequency of the allowable frequency band of the master RF generator. Although the slave RF generator 24, 24' can also be frequency agile, the slave detector 28, 28b has ready access to the frequency of the slave RF generator so no detection band is needed. If $f_s \gg f_m$, then the intermodulation products are likely to be within the pass band of any analog filtering in the system and are usually removed by digital filters that are frequency agile and are centered on $f_s$. Thus, another digital filter can be used to extract power in the desired window of detection.

There are two approaches to handle this detection eye. With reference to FIG. 6, one approach is to detect power on both sides of $f_s$ simultaneously. This approach works well when the analog filter is wide enough to pass the intermodulation products no matter where $f_s$ is in its permissible frequency band. However, some analog filters are tuned narrowly around the permissible frequency band of the slave RF generator. Some intermodulation products are not detectable when $f_s$ is far from its center frequency, as illustrated in FIG. 7. A second approach is to detect $f_s+f_{imd}$ when $f_s$ is less than $f_{sc}$, where $f_{sc}$ (the center frequency of the slave) and $f_s-f_{imd}$ when $f_s$ is greater than $f_{sc}$. In various chamber configurations, the $f_s \pm 2f_{imd}$ intermodulation product may present a greater signal strength than the $f_s \pm f_{imd}$ intermodulation product and it is preferred to detect in the band that presents a greater signal to noise ratio.

Since the intermodulation products are only present when both RF generators are outputting power, there is an inherent delay between the time when a first RF generator turns off and when a second RF generator turns off. This delay is a function of the difference between detection and actuation. Since this scheme can only synchronize on the RF off event, both RF generators must be programmed with pulsing frequency and duty cycle information. Appropriate setting of these parameters can lead to an arbitrary sequence of RF on operation. Provisions are also possible for the delay of turning off the second RF generator.

Figure 8:
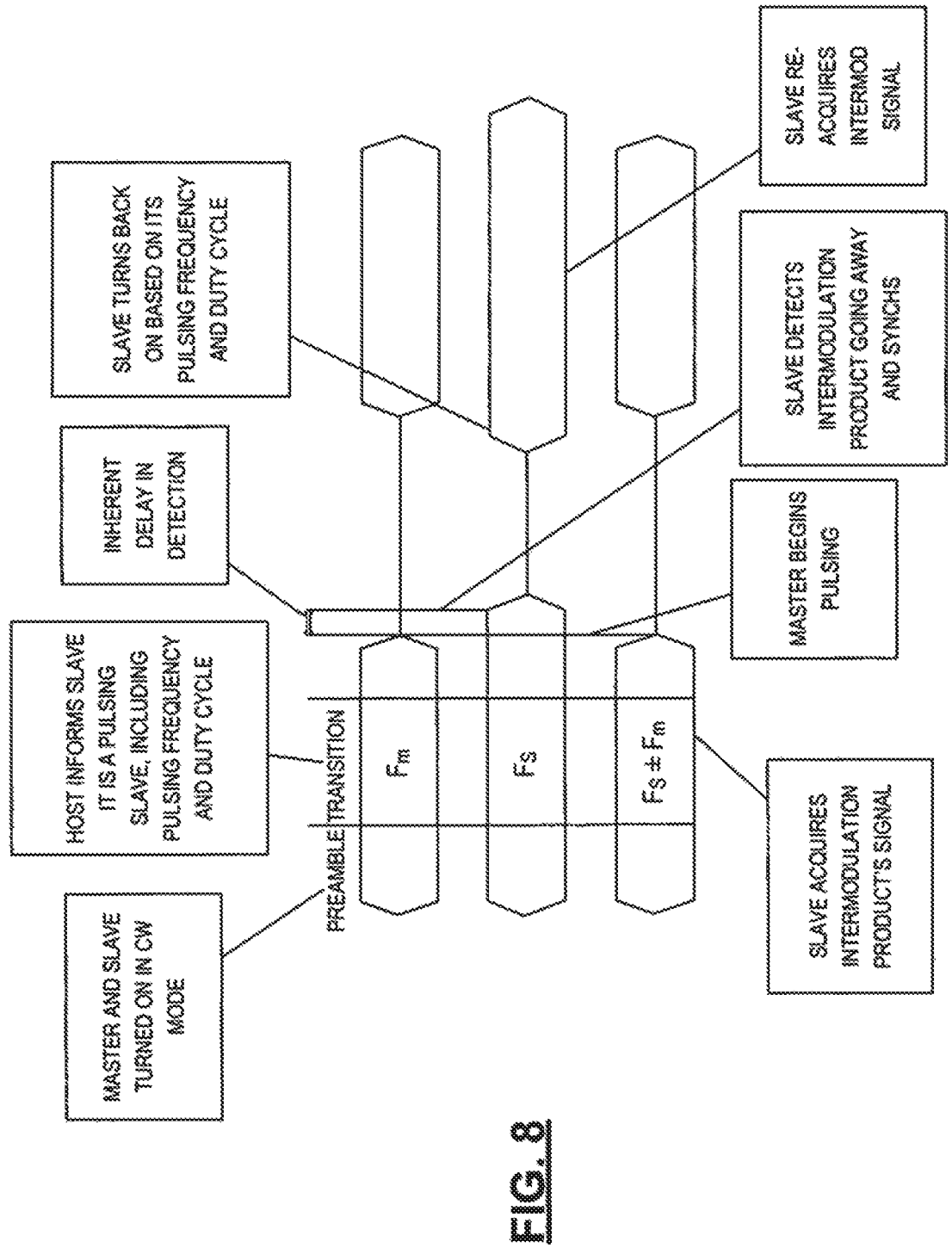
FIG. 8 illustrates a transition diagram for controlling synchronization in the presence of intermodulation products.

With reference to FIG. 8, a transition diagram for synchronization based on intermodulation products will be described. The master RF generator and the slave RF generator are first turned on in CW mode to ignite then stabilize the plasma. The host then directs the slave RF generator to operate as a pulsing slave RF generator with a specified pulsing frequency and duty cycle. The slave RF generator determines the frequency of the intermodulation product from a configuration setting or via an explicit command. The slave RF generator then acquires the signal of the intermodulation product. The host commands the master RF generator to start pulsing and to specify the pulsing frequency and duty cycle. The slave RF generator detects the intermodulation product going away and responds by pulsing its output off. This is the trigger for synchronization. In various embodiments, inherent delay exists in the detection system and this delay is accurately known by the slave RF generator. The host may command a pulsing delay from the time the master RF generator pulses off until the slave RF generator pulses off. In various embodiments, a controller such as a host, controls synchronization. In other various embodiments, the power RF generators can be configured to provide autonomous or semi-autonomous synchronization.

In various embodiments, the slave RF generator cannot pulse off before the master RF generator. The slave RF generator pulses on when its pulsing frequency and duty cycle obligations are met. The pulsing of the slave RF generator does not depend on the detection of an intermodulation product. In various embodiments, the master RF generator may pulse on before or after the slave. The slave RF generator reacquires the intermodulation product. The process repeats until the master RF generator stops pulsing or host commands a return to CW (Continuous Wave) operation.

Figure 9:
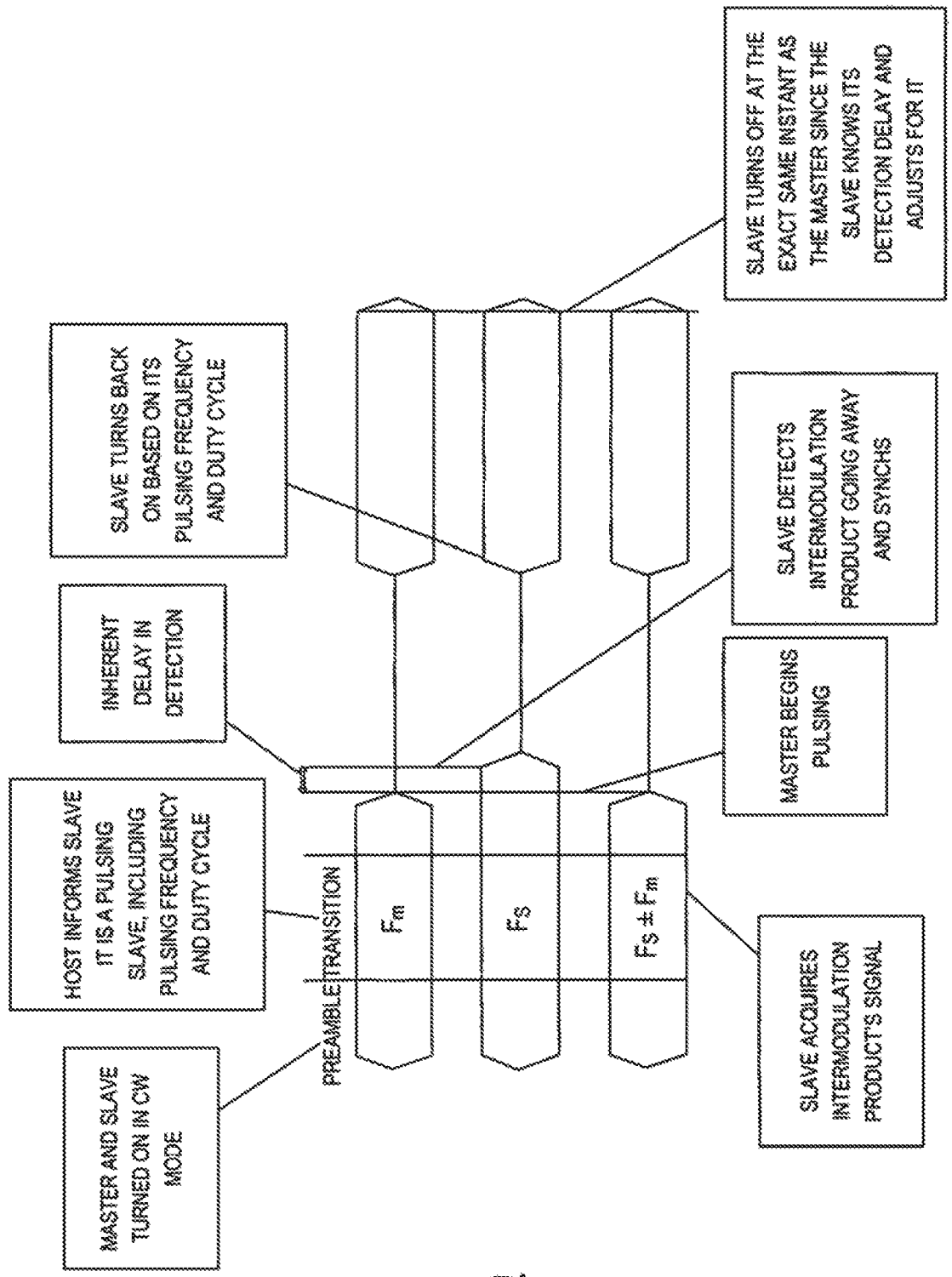
FIG. 9 illustrates a transition diagram for controlling synchronization in the presence of intermodulation products where the underlying clock frequencies are aligned.

With reference to FIG. 9, in various embodiments, if the internal clocks of the master RF and the slave RF generators are synchronized, further waveform manipulation is possible because the slave RF generator can determine when the master RF generator started turning off, based on the delay through the detector of the slave RF generator. This allows the slave RF generator to pulse synchronously. In this case, the host must also provide the slave RF generator and the master RF generator the pulsing duration so that both the master RF generator and the slave RF generator return to CW operation at the exact same time.

Figure 10:
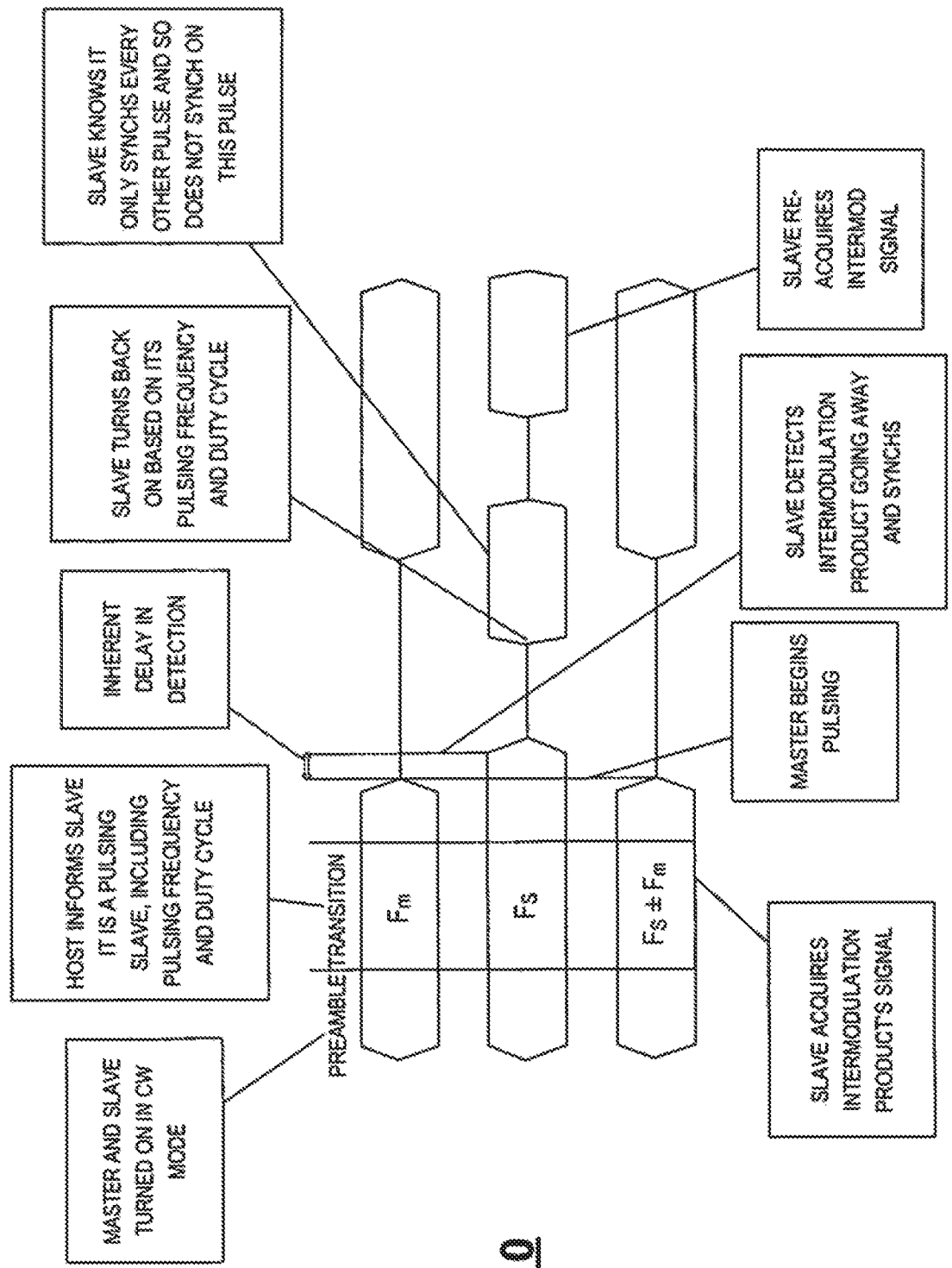
FIG. 10 Illustrates a transition diagram for controlling synchronization in the presence of intermodulation products when the master and the slave RF generators pulse at different frequencies, according to various embodiments.

With reference to FIG. 10, in various embodiments, other possibilities involve the master and the slave pulsing at different frequencies. Both frequencies are known to the slave so that it may synchronize after the least common multiple of the two RF generator's pulsing frequencies.

Figure 11:
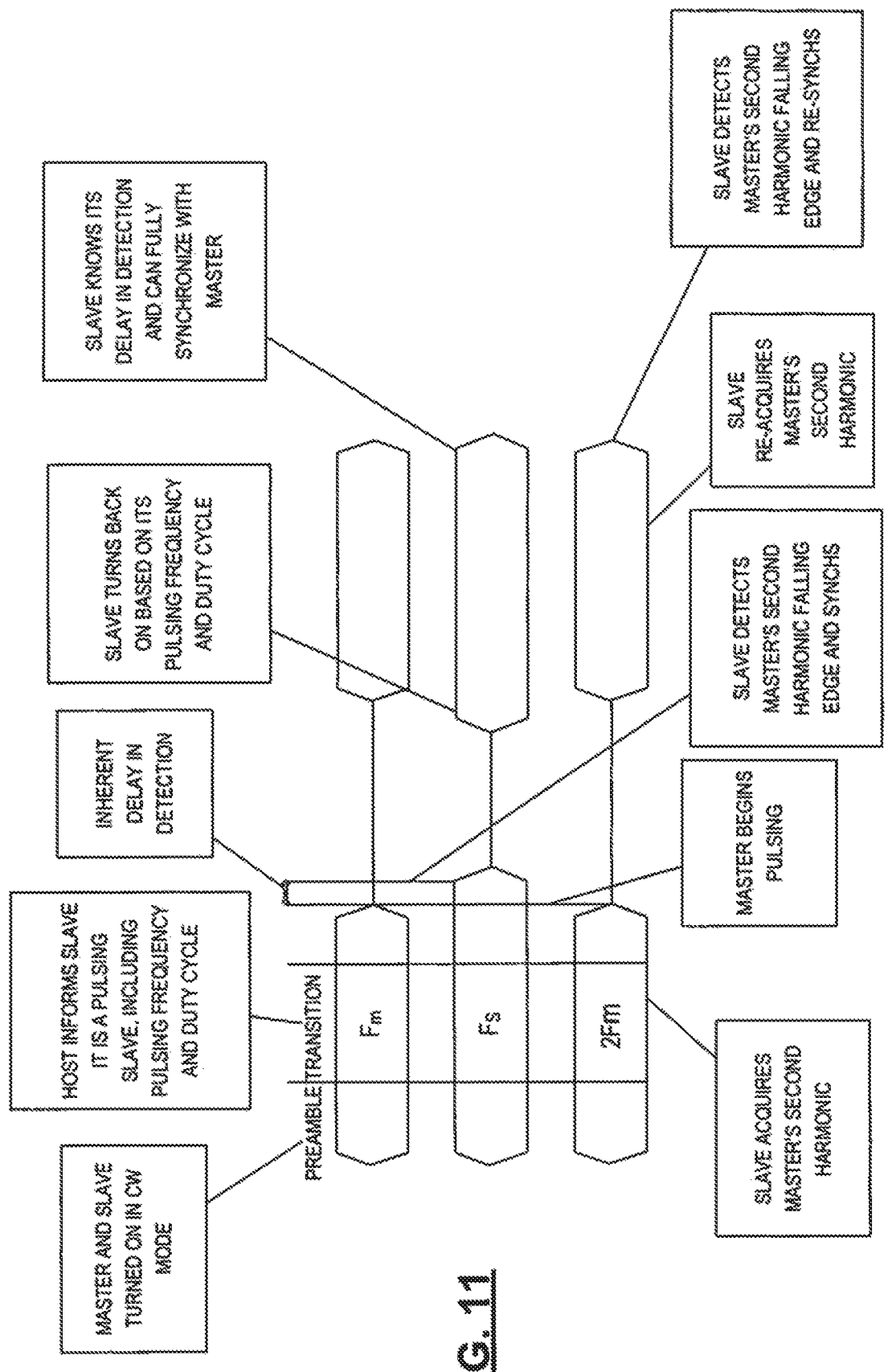
FIG. 11 illustrates a transition diagram for illustrating synchronization using a harmonic of one of the RF generators.

In various embodiments and with reference to FIG. 11, other systems have an inductively coupled plasma, and the master RF generator (the source) and the slave RF generator (the bias) output the same RF frequency. In this case, the slave RF generator will also be able to detect the first harmonic of the master RF generator. This results in a very similar scenario as the direct detection method of FIG. 4. The ability to synchronize two RF generators with synchronized clocks discussed above requires only that the host provide both the master and the slave RF generators with duration of the pulse train. With the duration of the pulse train known, a further embodiment exists where both the master and slave RF generators pulse in unison. The slave RF generator can predict when the master RF generator will turn off, because the slave RF generator detection delay is known and the slave RF generator has the pulsing frequency and duty cycle information and maintains synchronization since its output does not need to be on for it to detect the output of the master RF generator. In this scenario, the clock drift between the master and the slave only needs to be small over a single repetition of a pulse, not over the entire pulse train as was discussed in FIG. 9.

Figure 12:
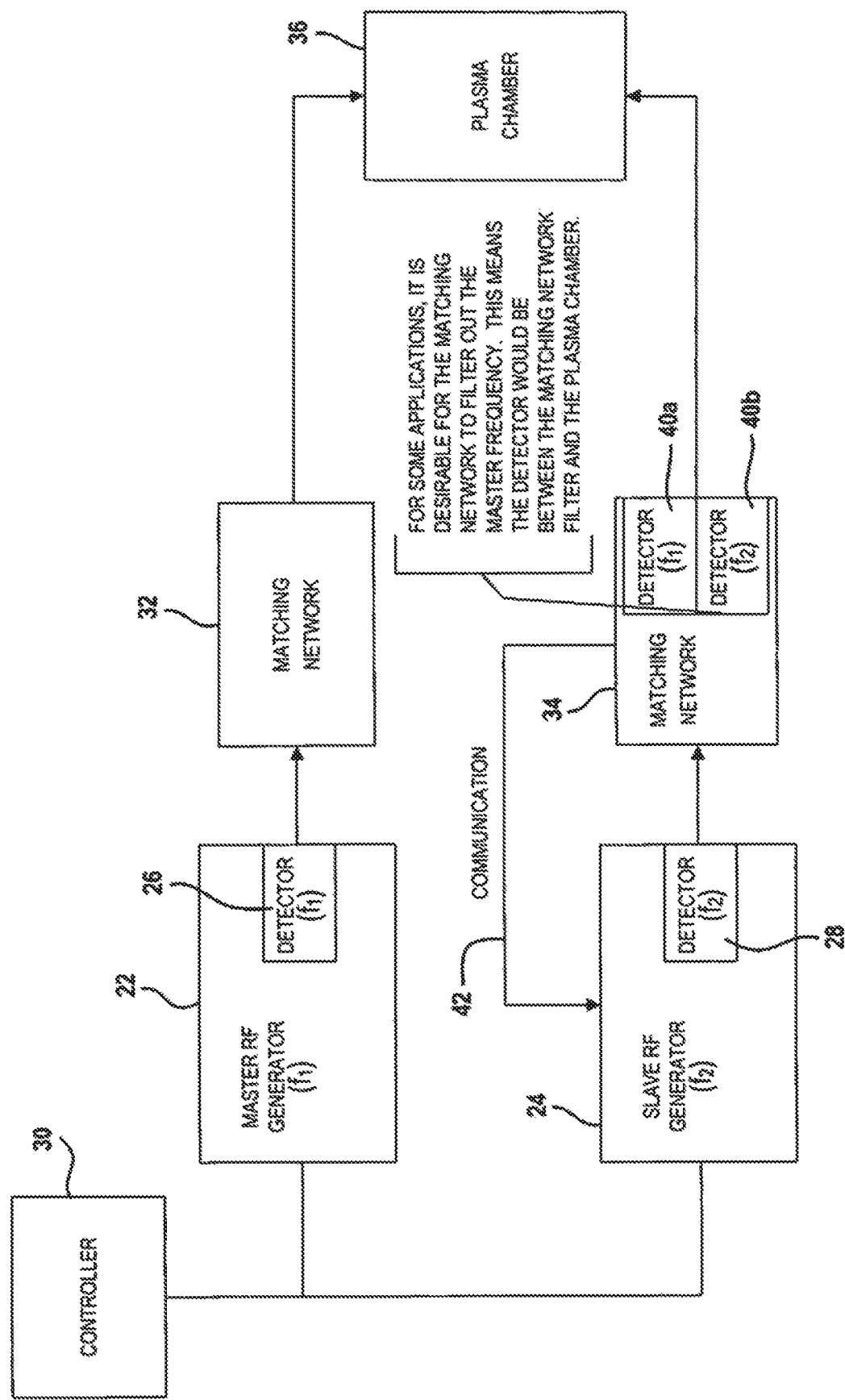
FIG. 12 is a functional block diagram in which the detectors for synchronization are placed in a matching network.

With reference to FIG. 12, FIG. 12 indicates various embodiments in which a matching network 34 can be used to filter out the master frequency. In such various embodiments, it may be necessary to locate the detector 40a, 40b between the matching network that functions as the filter and the plasma chamber 36. The detector of $f_1$ 40a and $f_2$ 40b as shown in FIG. 12 is located in the matching network. The detector 40a, 40b thus detects power at $f_1$ and $f_2$ prior to the reflected signal passing through the matching network 34 which also functions as a filter. The matching network 34 communicates with the slave RF generator 24 via a communication line 42 to provide data between the detector 40a, 40b located in the matching network 34 and a slave RF generator 24. In various embodiments, the communication link 42 can be implemented as an analog or digital communication link and operate at high speeds that enables sufficiently low loop times to effect control of the power applied to the plasma chamber.

Figure 13:
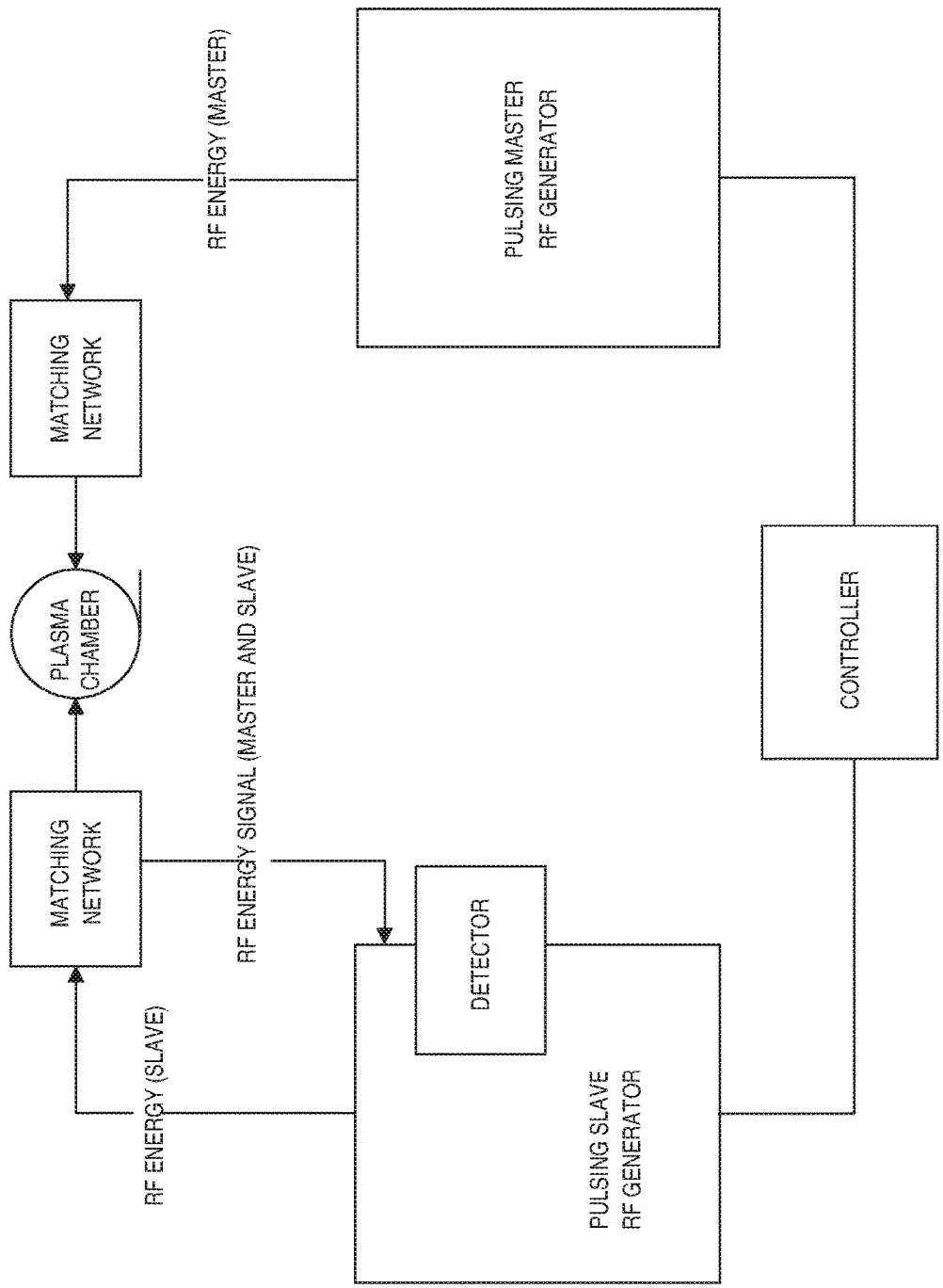
FIG. 13 is a functional block diagram in which a portion of a VI probe is located in the RF slave generator.

With reference to FIG. 13, FIG. 13 depicts a system 50 for implementing pulse syncing by monitoring power in another frequency band according to various embodiments. The controller 30 communicates with a pulsing master RF generator 22 and a pulsing slave RF generator 24. Each RF generator 22, 24 outputs a respective RF energy master output signal and a RF energy slave output signal to respective matching networks 32, 34. The matching networks 32, 34 perform a match function and apply the respective output powers to a plasma chamber 36. The matching network 32, 34 associated with the pulsing slave RF generator 24 generates an RF energy output signal which is representative of the output power of the master 22 and the slave 24 RF generators. The RF energy signal is applied to the pulsing slave RF generator 24. The pulsing slave RF generator 24 includes a detector 28. In various embodiments, the detector can be a digital filter for out-of-band rejection, such as a cascaded integrator-comb (CIC) filter. Applying the flow diagram, such as in FIG. 14, the RF slave generator 24 outputs signals that control the pulsing of the slave.

Figure 14:
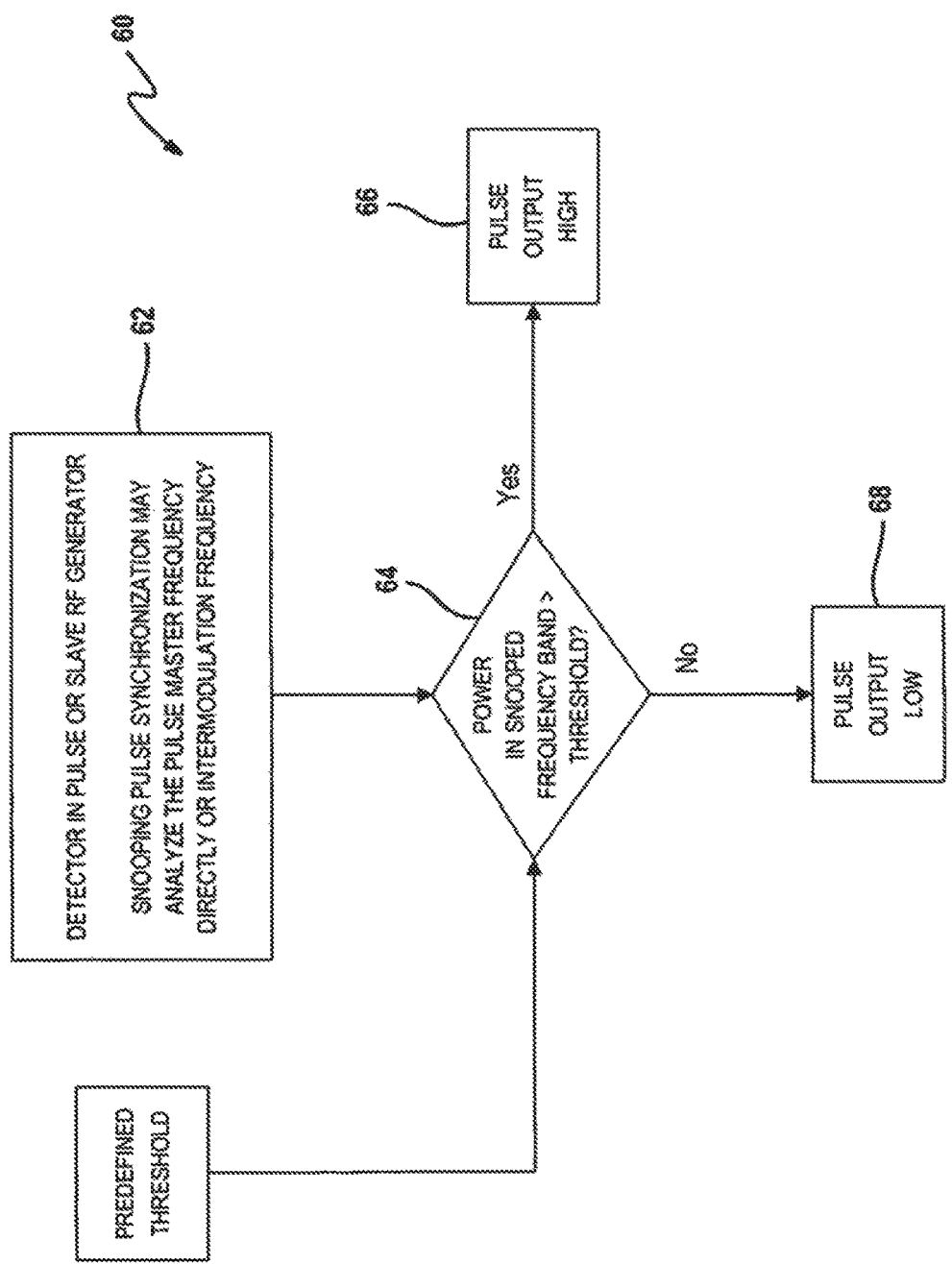
FIG. 14 is a flow diagram for control when pulsing occurs in the slave RF generator.

FIG. 14 depicts a flow diagram of a method or process 60 for determining whether to activate pulsing of the slave. A detector is placed in the pulse or slave RF generator. The detector in the pulse or slave RF generator, in various embodiments, may use the same analog-digital-converter (ADC) data as a compensator, while using different cascaded integrator-comb (CIC) filters. A snooping pulse synchronization process 62 analyzes the pulse master frequency directly or via intermodulation products frequency. The output from this process is the power in the snoop frequency band. At 64 this power is compared to a predetermined threshold 65. If the power is greater than a predetermined threshold, a pulse output high signal is generated at 66. If the power is less than the predetermined threshold, a signal indicating a pulse output low is generated at 68.

The present disclosure describes a signal processing apparatus and method for synchronizing pulse operation between a master and slave RF power supplies. The slave processes RF sampled signals to detect the presence of the master power supply. Once the master is detected by the slave, the slave synchronizes its pulse sequence with the pulsing sequence of the master RF power supply.

In general terms, detection of the presence of the RF master power supply by the slave power supply occurs by examining the RF spectrum. The slave monitors the spectrum to determine when the master RF power supply is energized. There are two approaches to detecting the master's RF signal in the spectrum. The first approach utilizes direct sampling of the RF spectrum to detect the presence of the master power supply. For example, if the frequency of the master power supply is fm, the slave will examine the slave's sampled spectrum to detect fm. In various embodiments, detection would examine the entire bandwidth of fm. A second approach utilizes the slave to detect a byproduct of the master's frequency. Byproducts of the master's frequency can include harmonics of the master's frequency. The byproducts can also include intermodulation distortion frequency content between the master and slave.

Figure 15:
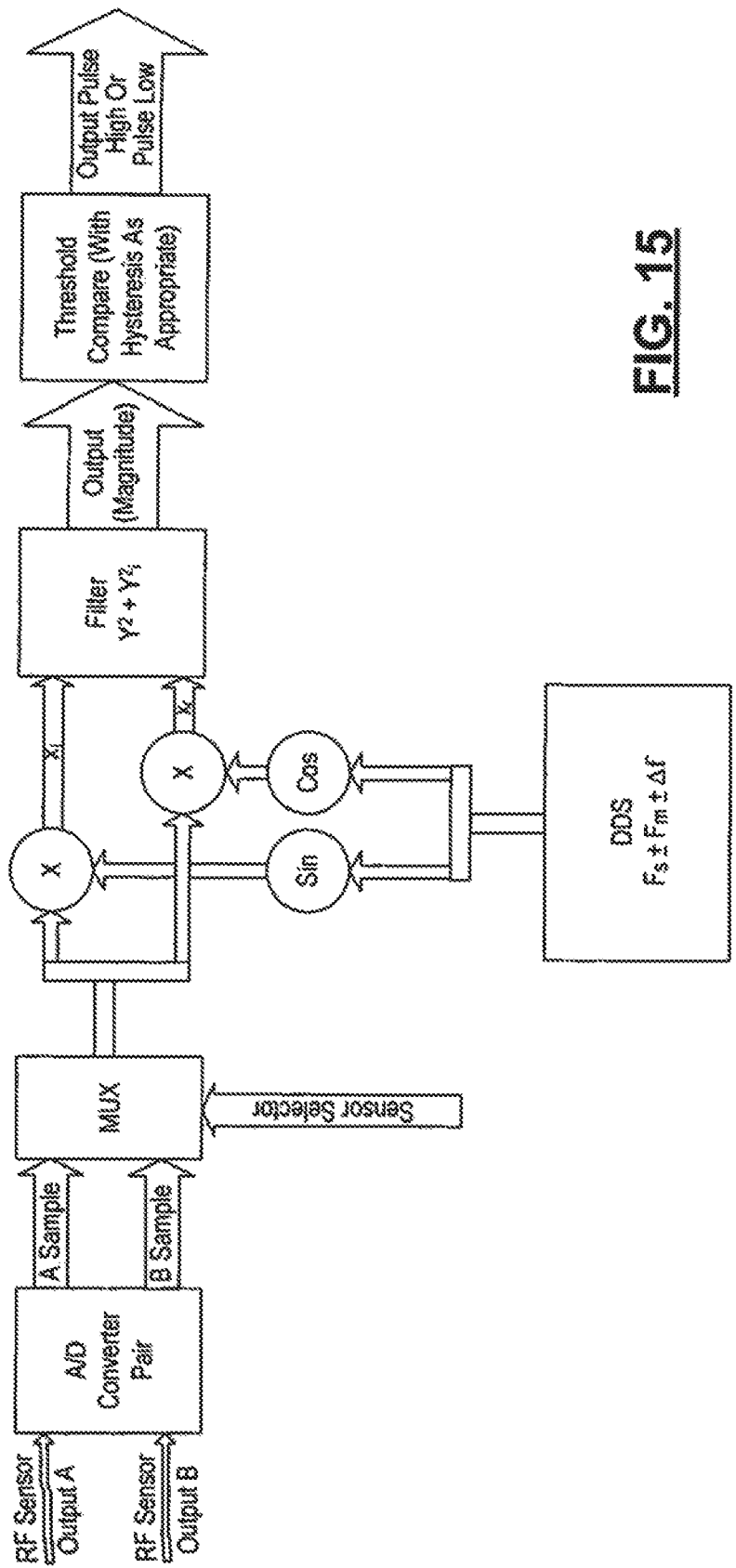
FIG. 15 is a functional block diagram of a system having a pair of RF generators according to various embodiments.

FIG. 15 depicts a block diagram of a signal processing apparatus and method to determine the presence of the RF of the master in the spectrum. Two RF signals A, B, from the multiport RF sensor of the slave are applied to and sampled by A/D detectors, shown schematically in FIG. 15. The RF signals are indicated as Output A and Output B. For a directional coupler type RF sensor, Output A can correspond to the forward power port, and Output B can correspond to the reverse power port. For a VI sensor type RF sensor, Output A can correspond to the voltage port, and Output B can correspond to the current port. The description will refer to the signals generally as Output A and Output B.

To detect the presence of the master power supply, the slave is configured with an adaptable multiplexer. The multiplexer chooses one of the two digitally sampled sensor signals, Output A or Output B. The selected digitally sampled sensor signal is then passed to a set of multipliers. One multiplier computes the product of the digitally sampled sensor output with the sine function. A second multiplier computes the product of the digitally sampled sensor output with the cosine function. These sinusoidal functions are constructed by a discrete digital synthesizer (DDS) at a frequency of $fs \pm fm \pm \Delta f$, where Fs represents a slave frequency and Fm represents a frequency of the master.

The set of multipliers and DDS yields two outputs from the digitally sampled selected signal to represent the spectrum of sampled sensor in quadrature components, $x_r + jx_i$. The complex quantity $x_r + jx_i$ is filtered to attenuate undesired frequency artifacts and retain the fs sensor signal represented as $\Delta f$. In various embodiments, a filter operation with a bandwidth of fm can be utilized, where fm is the frequency of the master. In various embodiments, due to its efficient implementation, a cascaded integrator-comb (CIC) filter can be employed. The output of this filter is a complex (real and imaginary components) signal, Y, of the sensor signal at the frequency of fs that is representative of the master RF power supply. The presence of the master RF power supply is determined by the magnitude of the complex signal from the output of the CIC filter. For efficiency, we compute the magnitude as the sum of the square of the complex signal, $Y^2_r + Y^2_i$, where Y indicates a filtered version of x. A threshold is applied to the magnitude as the final determination of the presence of the master RF power supply from the spectral content of the slave's RF sensor.

The sampling and filtering operation along with the magnitude computation operation has a finite and determinable delay in the signal processing chain. We use this offset to synchronize the slave pulsing sequence with the master. In various embodiments, multiple instances of this scheme can be deployed to synchronize pulsing between more than two power supplies. In various embodiments, signal slave can have multiple detectors corresponding to each of multiple (2 or more) master RF power supply frequencies. Similarly, a cascade master configuration could be adapted to this scheme. In various embodiments, the first slave can detect the presence of the master RF power supply frequency and the second slave can detect the first slave RF power frequency.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A radio frequency (RF) power delivery system comprising:
    a first RF generator providing a continuous wave (CW) first RF signal operating at a first frequency for delivery to a plasma chamber, the CW first RF signal being pulsed on and off at a first predetermined interval; and
    a second RF generator providing a continuous wave (CW) second RF signal operating at a second frequency for delivery to the plasma chamber, the CW second RF signal being pulsed on and off at a second predetermined interval and including a first detector, the first detector detecting pulsing on and off of the CW first RF signal and generating an output varying in accordance with the detected pulsing on and off of the CW first RF signal distorted by intermodulation products formed from harmonic products of the CW first RF signal and the CW second RF signal and a second detector, the second detector detecting an electrical property of the CW second RF signal in accordance with the intermodulation products,
    wherein operation of the second RF generator is synchronized in response to the output of the first detector to control pulsing of the CW second RF signal.

2. The RF power delivery system of claim 1 further comprising a controller controlling operation of the first RF generator and the second RF generator.

3. The RF power delivery system of claim 1 further comprising:
   a first matching network disposed between the first RF generator and the plasma chamber; and
   a second matching network disposed between the second RF generator and the plasma chamber.

4. The RF power delivery system of claim 3 wherein the first detector is configured to detect at least one of a rising edge of the CW first RF signal or a falling edge of the CW first RF signal.

5. The RF power delivery system of claim 1 wherein the first detector is configured to detect at least one of a rising edge or a falling edge of the CW first RF signal.

6. The RF power delivery system of claim 1 wherein the second RF generator is configured to activate simultaneously with the first RF generator.

7. The RF power delivery system of claim 1 wherein the second RF generator is configured to activate after a predetermined time from when the first RF generator activates.

8. The RF power delivery system of claim 1 wherein the second RF generator is configured to generate the CW second RF signal in a continuous wave mode of operation.

9. The RF power delivery system of claim 8 wherein the first RF generator is configured to selectively generate the CW first RF signal in a pulsed mode of operation.

10. The RF power delivery system of claim 1 wherein at least one of the first and second RF generators operates at a fixed frequency.

11. The RF power delivery system of claim 1 wherein at least one of the first and second RF generators operates at a variable frequency.

12. The RF power delivery system of claim 1 wherein the first predetermined interval and the second predetermined interval are one of the same or different.

13. A radio frequency (RF) power delivery system comprising:
   a plurality of RF generators providing a respective plurality of RF signals including respective continuous wave signals for delivery to a plasma chamber, at least one of the plurality of RF generators being pulsed on and off at a first predetermined interval and at least another of the plurality of RF generators is pulsed on and off at a second predetermined interval; and
   a plurality of detectors associated with selected ones of the plurality of RF generators, the plurality of detectors configured to detect pulsing on and off of the selected ones of the respective plurality of RF signals of the plurality of RF generators located at the selected ones of the plurality of RF generators and generating respective outputs varying in accordance with the detected pulsing on and off of the respective plurality of RF signals and distorted by intermodulation products formed from harmonic products of the respective plurality of RF signals and selected other RF signals output by others of the plurality of RF generators,
   wherein operation of at least one of the another of the plurality of RF generators is synchronized in response to the output of a respective one of the plurality of detectors to control pulsing of the at least one of the another of the plurality of RF generators.

14. The RF power delivery system of claim 13 further comprising a controller controlling operation of selected ones of the plurality of RF generators.

15. The RF power delivery system of claim 13 wherein at least one of the plurality of detectors is configured to detect at least one of a rising edge of the selected ones of the plurality of RF signals or a falling edge of the selected ones of the respective plurality of RF signals.

16. The RF power delivery system of claim 13 wherein at least one of the plurality of RF generators is configured to activate simultaneously with the at least another of the plurality of RF generators.

17. The RF power delivery system of claim 13 wherein at least one of the plurality of RF generators is configured to activate after a predetermined time from when the at least another of the plurality of RF generators activates.

18. The RF power delivery system of claim 13 wherein at least one of the plurality of RF generators is configured to selectively generate a RF signal in a continuous wave mode of operation.

19. The RF power delivery system of claim 18 wherein at least one of the plurality of RF generators is configured to generate a corresponding RF signal in a pulsed mode of operation.

20. The RF power delivery system of claim 13 wherein at least one of the plurality of RF generators operates at a fixed frequency.

21. The RF power delivery system of claim 13 wherein at least one of the plurality of RF generators operates at a variable frequency.

22. The RF power delivery system of claim 13 wherein the first predetermined interval and the second predetermined interval are one of the same or different.

23. A radio frequency (RF) power delivery system comprising:
   a first RF generator providing a first RF signal including a first continuous wave signal operating at a first frequency for delivery to a plasma chamber, the first RF signal being pulsed on and off at a first predetermined interval; and
   a second RF generator providing a second RF signal including a second continuous wave signal operating at a second frequency for delivery to the plasma chamber, the second RF signal being pulsed on and off at a second predetermined interval and including a first detector,
   a first matching network disposed between the first RF generator and the plasma chamber; and
   a second matching network disposed between the second RF generator and the plasma chamber, the second matching network including the first detector, the first detector detecting pulsing on and off of the first RF signal and generating an output in accordance with the detected pulsing on and off of the first RF signal distorted by intermodulation products formed from harmonic products of the first RF signal and the second RF signal, and a second detector, the second detector detecting an electrical property of the second RF signal,
   wherein the second RF generator is configured to respond to the output of the first detector to control pulsing of the second RF signal synchronously with the first RF signal.

24. The RF power delivery system of claim 23 further comprising a controller controlling operation of the first RF generator and the second RF generator.

25. The RF power delivery system of claim 23 wherein the first detector is configured to detect at least one of a rising edge of the first RF signal or a falling edge of the first RF signal.

26. The RF power delivery system of claim 25 wherein the first detector is configured to detect at least one of the rising edge or the falling edge of the first RF signal.

27. The RF power delivery system of claim 23 wherein the second RF generator is configured to activate simultaneously with the first RF generator.

28. The RF power delivery system of claim 23 wherein the second RF generator is configured to activate after a predetermined time from when the first RF generator activates.

29. The RF power delivery system of claim 23 wherein the second RF generator is configured to selectively generate the second RF signal in a continuous wave mode of operation.

30. The RF power delivery system of claim 29 wherein the first RF generator is configured to generate the first RF signal in a pulsed mode of operation.

31. The RF power delivery system of claim 23 wherein at least one of the first and second RF generators operates at a fixed frequency.

32. The RF power delivery system of claim 23 wherein at least one of the first and second RF generators operates at a variable frequency.

33. The RF power deliver system of claim 23 wherein the first predetermined interval and the second predetermined interval are one of the same or different.

34. A radio frequency (RF) power system comprising:
a first RF generator providing a first RF signal having a first frequency for delivery to a plasma chamber, the first RF signal being a continuous wave signal operating at a first frequency, the first RF signal being pulsed on and off at a first predetermined interval; and
a second RF generator providing a second RF signal at the first frequency for delivery to the plasma chamber and including a first detector, the second RF signal being a continuous wave signal operating at a second frequency, the second RF signal being pulsed on and off at a second predetermined interval, the first detector detecting a first harmonic of the first RF signal distorted by intermodulation products formed from harmonic products of the first RF signal and the second RF signal and generating an output in accordance with the first harmonic of the first RF signal and the intermodulation products,
wherein the second RF generator is responsive to the output of the first detector to control pulsing of the second RF signal synchronously with the output of the first RF signal.

35. The RF power system of claim 34 further comprising a controller controlling operation of the first RF generator and the second RF generator.

36. The RF power system of claim 34 wherein the first RF generator and the second RF generator receive information related to a duration of a pulse train.

37. The RF power system of claim 34 wherein the second RF generator utilizes pulse frequency and duty cycle information to synchronize with the first RF generator.

38. The RF power system of claim 34 wherein the second RF generator is configured to generate the second RF signal in one of a continuous wave mode of operation or a pulsed mode of operation.

39. The RF power system of claim 34 wherein at least one of the first and second RF generators operates at one of a fixed frequency or a variable frequency.

40. The RF power system of claim 34 wherein the first predetermined interval and the second predetermined interval are one of the same or different.

* * * * *